United States Patent
Won et al.

(10) Patent No.: US 9,391,245 B2
(45) Date of Patent: *Jul. 12, 2016

(54) SIALON PHOSPHOR, METHOD FOR PRODUCING SAME, AND LIGHT-EMITTING DEVICE PACKAGE USING SAME

(75) Inventors: Hyong Sik Won, Suwon-si (KR); Chul Soo Yoon, Suwon-si (KR); Youn Gon Park, Suwon-si (KR); Chang Bun Yoon, Bucheon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 402 days.

This patent is subject to a terminal disclaimer.

(21) Appl. No.: 13/825,276

(22) PCT Filed: Sep. 19, 2011

(86) PCT No.: PCT/KR2011/006908
§ 371 (c)(1),
(2), (4) Date: Sep. 19, 2013

(87) PCT Pub. No.: WO2012/039566
PCT Pub. Date: Mar. 29, 2012

(65) Prior Publication Data
US 2014/0008680 A1 Jan. 9, 2014

(30) Foreign Application Priority Data

Sep. 20, 2010 (KR) .................. 10-2010-0092534

(51) Int. Cl.
*C09K 11/64* (2006.01)
*H01L 33/50* (2010.01)
(Continued)

(52) U.S. Cl.
CPC ............. *H01L 33/502* (2013.01); *B22F 3/02* (2013.01); *C09K 11/0883* (2013.01);
(Continued)

(58) Field of Classification Search
CPC ........... C09K 11/7734; C09K 11/7721; H01L 33/502
See application file for complete search history.

(56) References Cited

U.S. PATENT DOCUMENTS 8,926,864 B2 * 1/2015 Ichikawa et al. ......... 252/301.4 F
9,120,973 B2 * 9/2015 Won .................. C09K 11/0883
(Continued)

FOREIGN PATENT DOCUMENTS

CN 101023150 A 8/2007
CN 101044223 A 9/2007
(Continued)

OTHER PUBLICATIONS

First Office Action Chinese Patent Application No. 201180055414.9 dated Mar. 14, 2014 with English translation.
(Continued)

*Primary Examiner* — Carol M Koslow

(57) ABSTRACT

According to one embodiment of the present invention, a method for producing a sialon phosphor comprises: mixing a silicon precursor and an aluminum precursor and sintering the mixture to form a first sintered body; and mixing the first sintered body and a precursor for an active material and heat-treating the mixture to form a second sintered body. That is, the method for producing a sialon phosphor according to one embodiment of the present invention involves firstly forming the first sintered body serving as a host material to stably ensure a crystal structure, and then mixing the active material and the first sintered body so as to preserve the role of the active material without sacrificing the crystal structure of the first sintered body. Eventually, the active material in the crystal structure of the first sintered body is located in an interstitial site not located in the Si or Al position, thereby preventing the degradation of the crystallinity of the first sintered body. In addition, the crystal structure of the sialon phosphor produced by the above-described method is stable, and the sialon phosphor exhibits superior thermal stability at a high temperature, and therefore the degradation in the efficiency thereof caused by a shortened lifespan thereof is extremely slight even over long-term operation. In addition, the crystal structure of the sialon phosphor in the light-emitting device package comprising the sialon phosphor produced by the above-described method is stable, and therefore the degradation in luminance caused by a degradation of crystallinity may be prevented.

21 Claims, 3 Drawing Sheets

(51) Int. Cl.
*C09K 11/08* (2006.01)
*C09K 11/77* (2006.01)
*H05B 33/14* (2006.01)
*B22F 3/02* (2006.01)

(52) U.S. Cl.
CPC ........ *C09K 11/7728* (2013.01); *C09K 11/7734* (2013.01); *H05B 33/14* (2013.01); *H01L 2224/48091* (2013.01); *H01L 2224/48247* (2013.01); *H01L 2224/48257* (2013.01); *H01L 2924/181* (2013.01)

(56) References Cited

U.S. PATENT DOCUMENTS

| | | |
|---|---|---|
| 2006/0033083 A1 | 2/2006 | Sakane et al. |
| 2007/0075629 A1 | 4/2007 | Le Toquin et al. |
| 2008/0001126 A1 | 1/2008 | Hirosaki |
| 2009/0050845 A1* | 2/2009 | Hirosaki et al. ........ 252/301.4 F |
| 2009/0057611 A1 | 3/2009 | Hirosaki |
| 2012/0306356 A1* | 12/2012 | Yoon et al. .................... 313/503 |

FOREIGN PATENT DOCUMENTS

| | | |
|---|---|---|
| CN | 101146891 A | 3/2008 |
| JP | 2006-045271 A | 2/2006 |
| JP | 2007-031201 A | 2/2007 |
| JP | 2010-047772 A | 3/2010 |
| KR | 10-2007-0113266 A | 11/2007 |
| KR | 10-2008-0059418 A | 6/2008 |
| WO | 2006/011317 A1 | 2/2006 |
| WO | WO 2011/099800 * | 8/2011 |
| WO | WO 2011/142228 * | 11/2011 |

OTHER PUBLICATIONS

R.-J. Xie et al., "Synthesis and Photoluminescence Properties of β-sialon: Eu2+(Si6—zAlzOzN8—z:Eu2+)", Journal of the Electrochemical Society, 154(10), J314-J319, (2007).

International Search Report PCT/KR2011/006908 dated Apr. 27, 2012.

* cited by examiner

US 9,391,245 B2

SIALON PHOSPHOR, METHOD FOR PRODUCING SAME, AND LIGHT-EMITTING DEVICE PACKAGE USING SAME

CROSS-REFERENCE TO RELATED APPLICATIONS

This application is the U.S. National Stage of International Application No. PCT/KR2011/006908, filed Sep. 19, 2011, and claims benefit of priority to Korean Patent Application No. 10-2010-0092534 filed on Sep. 20, 2010, in the Korean Intellectual Property Office, the entire contents of which are hereby incorporated by reference.

TECHNICAL FIELD

The present application relates to a sialon phosphor, a method for preparing the same, and a light emitting device package using the same, and more particularly to a sialon phosphor capable of improving luminance, a method for preparing the same, and a light emitting device package using the same.

BACKGROUND

A phosphor is used for a vacuum fluorescent display (VFD), a field emission display (FED), a plasma display panel (PDP), a light emitting display (LED), or the like. To make a phosphor emit light, energy for rendering the phosphor excited is supplied to the phosphor, and the phosphor is excited by an excitation source having high energy, for example, vacuum ultraviolet rays, ultraviolet rays, electron beams, and blue light. However, since the phosphor is deformed by these excitation sources and thus tends to involve a decrease in luminance and to deteriorate, a phosphor having less luminance degradation is required. Accordingly, sialon phosphors, which show a slow decay in luminance, are introduced instead of silicate phosphors, phosphate phosphors, aluminate phosphors, and sulfide phosphors.

A sialon phosphor is a type of acid nitride having Si, Al, O, and N and includes an α-sialon phosphor and a β-sialon phosphor which have different crystal structures. Non-patent Literature 1 discloses an α-sialon phosphor, while Patent Documents 1, 2, 3, and 4 disclose an α-sialon phosphor and a light emitting device using the same. Also, Patent Document 5 discloses a β-sialon phosphor, while Patent Document 6 discloses a β-sialon phosphor and a light emitting device using the same.

[Non-patent Literature 1] J. W. H. vankrebel "On new rare earth doped M-Si—Al—O—N materials," Tu Eindhoven The Netherland, P145-161 (1998)
[Patent Document 1] JP Patent Publication No. 2002-363554
[Patent Document 2] JP Patent Publication No. 2003-336059
[Patent Document 3] JP Patent Publication No. 2004-238505
[Patent Document 4] JP Patent Publication No. 2007-31201
[Patent Document 5] JP Patent Publication No. S60-206889
[Patent Document 6] JP Patent Publication No. 2005-255895

α-sialon is a crystal structure having a unit structure represented by $Si_{12-(m+n)}Al_{(m+n)}O_nN_{8-n}$, in which two interstitial sites are present. Metal ions having a relatively small radius, for example, $Ca^{2+}$, may be engaged in the interstitial sites of the crystal structure, and α-sialon engaging the metal ions may be represented by a general formula $M_{m/v}Si_{12-(m+n)}Al_{(m+n)}O_nN_{8-n}$:Eu, wherein M is a metal ion and V is a valence thereof. As stated in Non-patent Literature 1 and Patent Document 1, α-sialon engaging Ca and an active material Eu is known as a phosphor emitting light in a yellow region. Since this phosphor has a continuous excitation band from an ultraviolet region to a blue region and thus emits yellow light by irradiation of ultraviolet rays or blue light, the phosphor may be used as a yellow phosphor for a white light emitting device.

This phosphor may be prepared by mixing proper amounts of precursor materials obtained from powders of silicon nitride, aluminum nitride, calcium carbonate ($CaCO_3$), and europium oxide as starting materials and sintering the mixture at a high temperature in a nitrogen atmosphere. Further, a substrate of a high purity material with a limited amount of impurities disclosed in Patent Document 3 or metal silicone disclosed in Patent Document 4 are used so as to achieve high luminance.

Meanwhile, β-sialon is represented by a general formula $Si_{6-x}Al_xO_xN_{6-x}$. Patent Documents 5 and 6 disclose a β-sialon phosphor prepared by adding an active material to β-sialon. Patent Document 5 discloses a β-sialon phosphor obtained using β-sialon and an active material, for example, Cu, Ag, or a rare-earth element such as Eu. However, it is reported that a Eu-activated β-sialon phosphor of Patent Document 5 emits light in a blue wavelength region from 410 nm to 440 nm, while a phosphor disclosed in Patent Document 6 is a green phosphor. Difference in emission color between the phosphors is probably due to a fact, as mentioned in Patent Document 6, that the active material Eu is not securely engaged in β-sialon since the Eu-activated β-sialon of Patent Document 5 has a low sintering temperature.

A Eu-activated β-sialon phosphor of Patent Document 6 emits green light and is excited by light in a blue wavelength region. Thus, the Eu-activated β-sialon phosphor attracts attention as a green light emitting phosphor for a white light emitting device, which is constituted by a blue light emitting device and a phosphor or by an ultraviolet light emitting device and a phosphor. In particular, the Eu-activated β-sialon phosphor has a narrow spectrum width of about 55 nm and good color purity and thus is expected to be used as a green phosphor for a white light emitting device requiring color reproducibility. However, since the Eu-activated β-sialon phosphor does not have sufficiently high luminance, enhancement of luminance is necessary.

A β-sialon phosphor is also prepared by mixing proper amounts of materials obtained from powders of silicon nitride, aluminum nitride, and an active material as starting materials and sintering the mixture at a high temperature in a nitrogen atmosphere. However, a β-sialon phosphor obtained by a currently known method using nitrides, such as silicon nitride or aluminum nitride, as a starting material does not have a sufficiently high luminance.

That is, in a conventional method of synthesizing a rare-earth element added β-sialon phosphor, raw materials including oxides and nitrides, such as $Si_3N_4$, $SiO_2$, AlN, $Al_2O_3$, and $Eu_2O_3$, are mixed, and synthesized at 1,900° C. or higher in a nitrogen atmosphere. However, when β-sialon is synthesized by mixing a rare-earth element used as a bivalent cation activator in mixing the raw materials, other cations than Si and Al, which form sialon, may serve as impurities, degrading crystallinity of β-sialon, which may cause a decrease in luminance of the phosphor.

Further, as described above, although a yellow YAG phosphor is applied to a light emitting device to realize a white light emitting device for the first time, the white light emitting device shows a low color rendering index (CRI) as compared with a common lamp. Thus, a white light emitting device having an improved CRI by using green and red phosphors has been recently developed. As a green phosphor applied to the device, a silicate phosphor or a sulfide phosphor is used. However, such phosphors exhibit low high-temperature, thermal, and chemical stabilities, and thus a phosphor using nitrides is vigorously studied. Since a nitride phosphor is obtained by adding an activator to a host material, such as $Si_3N_4$ and sialon used for a high-temperature structure materials, the phosphor has remarkably superior thermal, chemical, and physical stabilities. Thus, the phosphor may be used to realize a white light emitting device having a long life and excellent thermal stability when applied to a TV backlight and a lighting lamp. However, this phosphor has 70% or less of efficiency than the YAG phosphor, and thus improvement in efficiency is needed.

SUMMARY

An aspect of the present application provides a sialon phosphor, a method for preparing the same, and a light emitting device package using the same.

According to an aspect of the present application, there is provided a method for preparing a sialon phosphor including forming a first sintered body by mixing and sintering a silicon precursor and an aluminum precursor, and forming a second sintered body by mixing and heat-treating the first sintered body and an active material precursor.

The sialon phosphor may be represented by Formula 1:

   [Formula 1]

where $0.1<x<2$, $0.1<y<2$, $0.001<z<0.1$, and Re is a rare-earth element.

The silicon precursor may include metallic silicon or a silicon compound.

The silicon compound may be selected from the group consisting of silicon nitride and silicon oxide.

The aluminum precursor may include metallic aluminum or an aluminum compound.

The aluminum compound may be selected from the group consisting of aluminum nitride, aluminum oxide, and aluminum hydroxide.

The active material precursor may include a compound containing a rare-earth element.

The rare-earth element may be selected from the group consisting of Eu and Ce.

The sintering may be carried out at 1,500° C. to 2,200° C.

The heat-treating may be carried out at 1,000° C. to 2,100° C.

The sintering and the heat-treating may be carried out in a nitrogen containing atmosphere.

A pressure of nitrogen gas in the nitrogen containing atmosphere may be 0.1 to 10 MPa.

The mixing of the first sintered body and the active material precursor may include mixing with a compound containing an alkaline earth metal.

The alkaline earth metal may be selected from the group consisting of magnesium (Mg), calcium (Ca), strontium (Sr), and barium (Ba).

The mixing of the first sintered body and the active material precursor may include mixing with a manganese (Mn) containing compound.

The sialon phosphor may emit light with a wavelength of 500 to 555 nm.

The method for preparing the sialon phosphor may further include grinding the first sintered body after the forming of the first sintered body.

The method for preparing the sialon phosphor may further include grinding the second sintered body after the forming of the second sintered body.

According to another aspect of the present application, there is provided a sialon phosphor including a first sintered body obtained by sintering a silicon precursor and an aluminum precursor, each of which lacks an active material precursor, and an active material, the sialon phosphor and being represented by Formula 1:

   [Formula 1]

where $0.1<x<2$, $0.1<y<2$, $0.001<z<0.1$, and Re is a rare-earth element.

According to still another aspect of the present application, there is provided a light emitting device package including a light emitting device to emit excited light and a wavelength conversion unit to absorb the excited light and convert a wavelength of the excited light, wherein the wavelength conversion unit includes a sialon phosphor including a first sintered body obtained by sintering a silicon precursor and an aluminum precursor, each of which lacks an active material precursor, and an active material, the sialon phosphor being represented by Formula 1:

   [Formula 1]

where $0.1<x<2$, $0.1<y<2$, $0.001<z<0.1$, and Re is a rare-earth element.

According to an example of the present application, a method for preparing a sialon phosphor includes forming a first sintered body by mixing and sintering a silicon precursor and an aluminum precursor, and forming a second sintered body by mixing and heat-treating the first sintered body and a precursor of an active material. That is, the method for preparing the sialon phosphor according to the example of the present application involves firstly forming the first sintered body serving as a host material to stably ensure a crystal structure, and then mixing the active material and the first sintered body so as to add the active material without sacrificing the crystal structure of the first sintered body.

Ultimately, the active material in the crystal structure of the first sintered body is located in an interstitial site, not located in a Si or Al position, thereby preventing degradation of crystallinity of the first sintered body.

In addition, since the sialon phosphor prepared by the above-described method has a stable crystal structure and exhibits superior thermal stability at a high temperature, a decrease in efficiency thereof caused by a shortened lifespan thereof is insignificant even over a long-term operation.

Also, due to a stable crystal structure of the sialon phosphor prepared by the above-described method, a light emitting device package including the sialon phosphor may prevent a decrease in luminance caused by crystallinity degradation.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF DRAWINGS

The above and other aspects, features and other advantages of the present application will be more clearly understood from the following detailed description taken in conjunction with the accompanying drawings, in which:

FIG. 7 is a graph illustrating integrated intensities of β-sialon phosphors prepared in Examples 1 and 4 to 9;

FIG. 8 is a graph illustrating peak emission wavelengths and half-widths of β-sialon phosphors prepared in Examples 1 and 4 to 9;

FIG. 9 is a cross-sectional view illustrating a white light emitting device according to an example of the present application; and FIG. 10 illustrates an emission spectrum of a white light emitting device according to an example of the present application.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

It will be understood that when a substrate, layer, chip, package, or film is referred to as being "on" or "under" another substrate, layer, chip, package, or film, the substrate, layer, chip, package, or film can be directly on or under the other substrate, layer, chip, package, or film, or intervening elements may be present. Further, spatially relative terms, such as "on" or "under." may be used herein to describe the relationship of one element to another element(s) based on the orientation depicted in the figures.

Hereinafter, a method for preparing a sialon phosphor according to an example of the present application will be described with reference to the accompanying drawings. In the specification, a method for preparing a β-sialon phosphor will be described first, and a method for preparing an α-sialon phosphor will be mentioned briefly without redundant descriptions.

Figure 1:
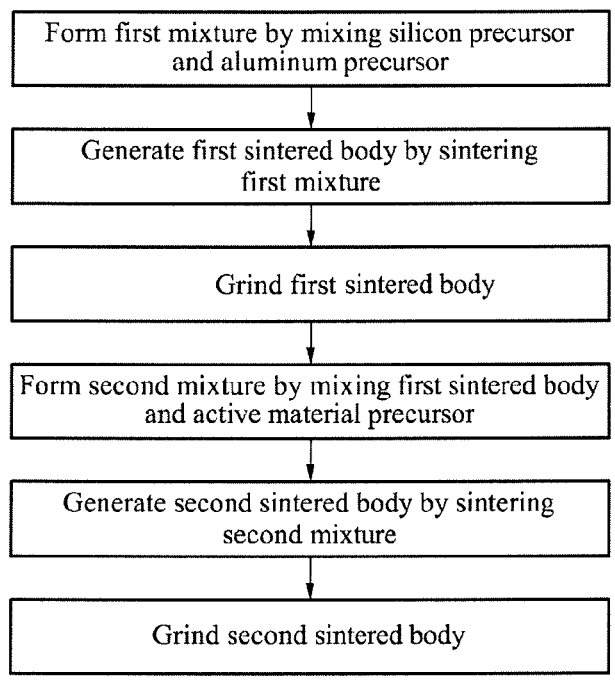
FIG. 1 is a flowchart illustrating a method for preparing a β-sialon phosphor according to an example of the present application.

FIG. 1 is a exemplary flowchart illustrating a method for preparing a β-sialon phosphor.

Referring to the example of FIG. 1, the method for preparing the β-sialon phosphor includes the step of forming a first mixture by measuring and mixing a silicon precursor and an aluminum precursor. A first sintered body is formed by sintering the first mixture. A second mixture is formed by mixing the first sintered body with an active material precursor. A second sintered body is formed by heat-treating the second mixture. Further, the method may include grinding the first sintered body after forming the first sintered body and grinding the second sintered body after forming the second sintered body.

The silicon precursor may include metallic silicon or a silicon compound. As the silicon precursor, metallic silicon may be used alone or in combination with a silicon compound. The silicon compound may be selected from the group consisting of silicon nitride and silicon oxide.

The metallic silicon is preferably a high purity powdery metallic silicon with a low content of impurities, such as Fe. A particle diameter or distribution of metallic silicon powder does not have a direct impact on a particle system of the phosphor. However, depending on sintering conditions or mixed raw materials, the particle diameter or distribution of the silicon powder affect exerts an impact not only on characteristics of the phosphor regarding particle size, such as a particle diameter or shape, but also on light emitting properties of the phosphor, and thus the metallic silicon powder preferably has a particle diameter of 300 μm or less.

Since the metallic silicon shows a higher reactivity with a smaller particle diameter, the metallic silicon preferably has smaller particles in view of reactivity. However, reactivity is also influenced by mixed raw materials or a sintering rate, and thus the metallic silicon does not necessarily have a small particle diameter and is not limited to a powder form.

The aluminum precursor may include metallic aluminum or an aluminum compound. As the aluminum precursor, metallic aluminum may be used alone or in combination with an aluminum compound. The aluminum compound may be selected from the group consisting of aluminum nitride, aluminum oxide, and aluminum hydroxide.

When the silicon precursor is metallic silicon, the aluminum precursor may not necessarily be metallic aluminum, but may be an aluminum compound alone.

When the metallic aluminum is used, high purity powdery metallic aluminum with a low content of impurities, such as Fe, is preferable. As mentioned above, the metallic aluminum preferably has a particle diameter of 300 μm or less. However, since reactivity is also influenced by mixed raw materials or a sintering rate, the metallic aluminum does not necessarily have a small particle diameter and is not limited to a powder form.

A method of mixing the silicon precursor and the aluminum precursor after measurement may be one of dry mixing and wet mixing.

First, according to a wet mixing method, the silicon precursor and the aluminum precursor, which are measured, balls to aid in mixing and grinding the precursors, and a solvent were mixed. Here, the balls may be silicon oxide ($Si_3N_4$), alumina ($Al_2O_3$) or zirconia ($ZrO_2$) balls, or balls generally used for mixing ingredients. The solvent may be deionized (DI) water, alcohols, such as ethanol, or organic solvents, such as n-hexane. That is, after putting the precursors, the solvent, and the balls in a container, the container is sealed, followed by homogenous mixing for about 0.1 to 100 hours using a miller or the like. When mixing is completed, a first mixture is separated from the balls and dried in an oven for 1 to 30 hours to evaporate the solvent mostly. Then, the dried powder is uniformly ground by a micrometer-sized sieve of metal or polymer.

Meanwhile, according to a dry mixing method, the precursors are put in a container without a solvent and homogenously mixed using a milling machine. Mixing is carried out for about 0.1 to 1 hour, in which the balls are added along with the precursors for ease of mixing, thereby reducing a mixing time. The dry mixing method may reduce a total process time as compared with the wet mixing method since a drying process of a solvent is not involved. After the precursors are mixed, the resulting powder may be uniformly ground using a desired micrometer-sized sieve of metal or polymer in the same manner as in the wet mixing method.

When a mixing ratio between the silicon precursor and the aluminum precursor is adjusted, particle characteristics of the β-sialon phosphor may be controlled. Furthermore, a mixing ratio between the metallic silicon and the silicon compound in the silicon precursor or a mixing ratio between the metallic aluminum and the aluminum compound in the aluminum precursor is adjusted, thereby controlling particle characteristics of the β-sialon phosphor.

As described above, in the method for preparing the β-sialon phosphor according to the present example, the silicon precursor including the metallic silicon or the silicon compound and the aluminum precursor including the metallic aluminum and the aluminum compound are firstly mixed and sintered. That is, the first mixture of the silicon precursor and the aluminum precursor is sintered at a high temperature in an atmosphere of nitrogen, thereby producing a first sintered body. Sintering may be carried out by tamping the sorted mixed powder in a boron nitride (BN) crucible.

Here, the first mixture may be sintered at 1,500 to 2,200° C. for 0.5 to 100 hours. Preferably, sintering is carried out at 1,900 to 2,200° C. for 1 to 30 hours. After sintering, the synthesized phosphor powder may be homogeneously ground using a grinder and then subjected to additional heat treatment.

In addition, the nitrogen atmosphere preferably has an $N_2$ gas concentration of 90% or higher. Further, the nitrogen atmosphere may have a gas pressure of 0.1 to 10 MPa. The nitrogen atmosphere may be formed by creating a vacuum state and then introducing a nitrogen containing gas. Alternatively, the nitrogen atmosphere may be formed by introducing a nitrogen containing gas without creation of a vacuum state, in which introduction of the gas may be discontinuously conducted. When the first mixture of the silicon precursor and the aluminum precursor is sintered in the nitrogen containing atmosphere, nitrogen reacts with silicon and aluminum to nitrify silicon, in which the nitrogen gas serves as a nitrogen supply source.

The first sintered body, obtained via sintering, is mixed with a rare-earth compound as an active material precursor to form a second mixture, which is subjected to heat treatment, thereby preparing a second sintered body. Mixing the first sintered body with the active material precursor for forming the second mixture and sintering the second mixture may be the same as forming the first mixture and sintering the first mixture except for additional descriptions.

That is, the first sintered body and the active material precursor are measured and mixed, wherein any one of wet mixing and dry mixing may be used. The resulting second mixture is subjected to heat treatment in a nitrogen containing atmosphere.

Heat treatment of the second mixture may be carried out at 1,000 to 2.100° C. Preferably, heat treatment is carried out at 1,800 to 2,100° C. After heat treatment of the second mixture, the second sintered body may be ground or sorted to adjust particle size thereof.

In one example, the method for preparing the phosphor may further include heat-treating the second sintered body in a reducing atmosphere after forming the second sintered body in order to accelerate reduction of europium oxide ($Eu_2O_3$). In the reducing atmosphere, a mixture of a $N_2$ gas with $H_2$, CO, or $NH_3$ may be used, wherein concentration of $H_2$, CO, or $NH_3$ added to the $N_2$ gas may be 0.1 to 10%. Heat treatment in the reducing atmosphere may be carried out at 1,000 to 1,700° C. for about 1 to 20 hours.

The rare-earth element as an active material may be selected from the group consisting of Eu, Ce, Pr, Nd, Sm, Gd. Tb, Dy, Ho, Er, Tm, and Yb. Preferably, the rare-earth element is Eu or Ce. The active material precursor may include oxides, such as $Eu_2O_3$, $Sm_2O_3$, $Yb_2O_3$, CeO, $Pr_7O_{11}$ and $Tb_3O_4$, $Eu(NO_3)_3$, EuN, or $EuCl_3$.

Figure 2:
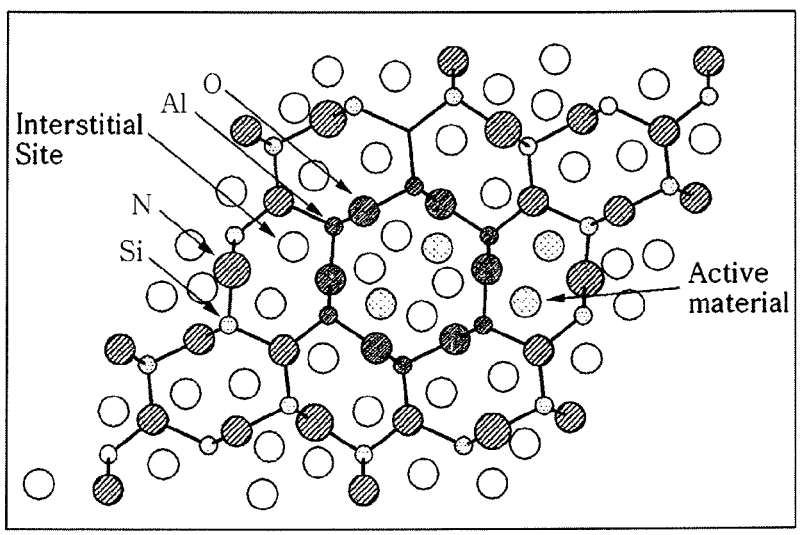
FIG. 2 illustrates a crystal structure of the β-sialon phosphor according to an example of the present application.

A nitride green phosphor may be realized by doping an interstitial site of a host matrix of a host matrix material, β-sialon, with an active material, in which a plurality of interstitial sites are present in a structure of β-sialon to include the active material therein, as shown in FIG. 2.

Thus, when Si or Al forming a host matrix material is mixed with the active material, ions of the active material are located in Si or Al positions, thereby degrading crystallinity of the host matrix material.

However, when the host matrix material is formed first and then mixed and sintered with the active material, the host matrix material secures a crystal structure already, that is, Si or Al already occupies the positions, and thus the active material subsequently added may be located in a plurality of interstitial sites in the crystal structure of β-sialon.

That is, the ions of the active material are not located in the Si or Al positions, but are dispersed over the interstitial sites of the crystal structure. Ultimately, the crystal structure of the host matrix material is not deformed by mixing and sintering the active material, thereby preventing a decrease in luminance.

Consequently, when silicon and aluminum firstly form a host matrix to generate β-sialon as in the method for preparing the β-sialon phosphor according to the present example, the obtained β-sialon does not include cations to occupy positions of silicon or aluminum in the crystal structure thereof, thus having a stable crystal structure.

Figure 3:
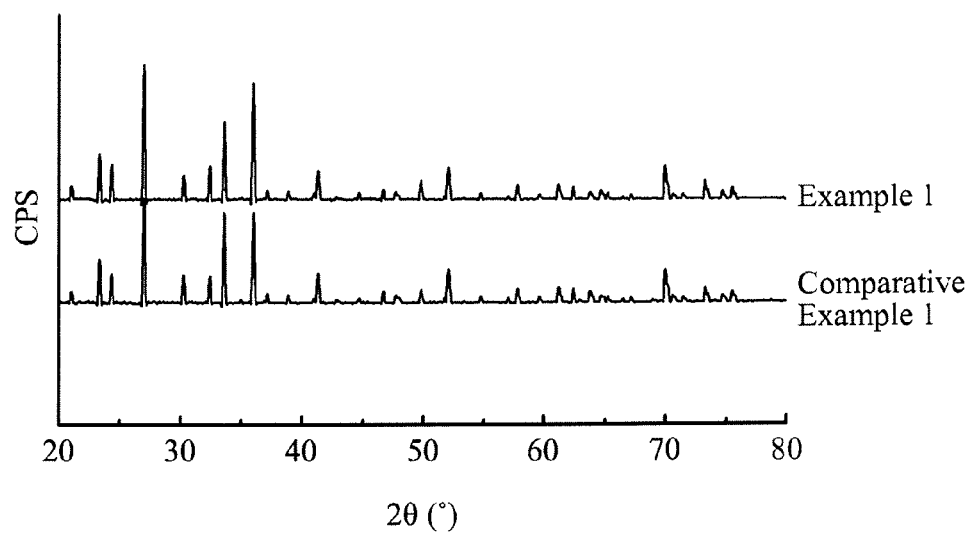
FIG. 3 is a graph illustrating XRD of β-sialon phosphors prepared in Example 1 and Comparative Example 1.

That is, when β-sialon is formed by mixing the silicon precursor and the aluminum precursor in advance, a crystal structure thereof may include a plurality of interstitial sites in a lattice of the structure, as shown in FIG. 2. In the end, when β-sialon having such a structure is mixed with the active material precursor, the active material is dispersed into the interstitial sites instead of the positions of silicon or aluminum, thereby not degrading crystallinity of β-sialon. Further, X-ray diffraction (XRD) peaks illustrated in FIG. 3 show that the active material does not have an impact on the crystallinity of the host matrix material.

Accordingly, when the fi-sialon phosphor prepared by the preceding method is used, luminance of a light emitting device may be improved.

Since cations of the rare-earth element do not hinder positioning of silicon or aluminum in the host matrix material, the host matrix material has excellent crystallinity. The excellent crystallization of the host matrix material may prevent a decrease in luminance of light.

In addition, in mixing the first sintered body and the active material precursor, an alkaline earth metal containing compound or manganese containing compound may be further mixed therewith. Alkaline earth metal may be selected from the group consisting of magnesium (Mg), calcium (Ca), strontium (Sr), and barium (Ba).

When the alkali earth metal containing compound or manganese containing compound is further added in mixing the first sintered body and the active material precursor, alkali earth metal or manganese does not substitute silicon or aluminum forming the host matrix, but is added as a dopant to the interstitial sites of the crystal structure. Ultimately, in one example, addition of alkali earth metal or manganese neither deforms nor affects the crystal structure of the host matrix.

Further, the alkaline earth metal or manganese contributes to phase stabilization of the β-sialon phosphor, thereby improving reliability, enhancing light emitting efficiency, and shortening a wavelength of light.

The alkaline earth metal or manganese may be added in an amount of 0.0001 to 10 mol %. When the amount of alkaline metal or manganese is less than 0.1 mol %, improvement in efficiency and a wavelength shortening effect are not sufficiently achieved. When the amount of alkaline earth metal or manganese is greater than 3 mol %, the phosphor has reduced efficiency as compared with a phosphor without such materials. Preferably, the amount of alkaline earth metal or manganese is 0.05 to 0.5 mol %.

In particular, the phosphor including alkaline earth metal or manganese shows luminance enhanced about 10% higher than a phosphor without alkaline earth metal or manganese, thus achieving high conversion efficiency.

Light emitted from the phosphor by irradiation of an excitation source has a peak wavelength of 530 to 545 nm, which tends to be relatively shortened. Thus, the phosphor may satisfy characteristics of green wavelengths, required in standard RGB, to a comparatively high extent. That is, when the light emitted from the phosphor by irradiation of the excitation source is expressed as (x, y) in a CIE 1931 chromaticity diagram, x and y satisfy x≤0.36 and y≥0.61, respectively, and thus the phosphor may be used effectively as a green phosphor providing vivid white light.

As described above, in the example, the alkali earth metal or manganese is added to the interstitial sites of the host matrix material and may even more stabilize a phase of the β-sialon phosphor, thus reducing efficiency change over time. Generally, efficiency change over time relies on a y chromaticity coordinate.

Such variation in y may be defined as y2−y1, wherein y1 is a y value of light in the CIE 1931 chromaticity diagram measured according to a measurement method, the light being emitted when the phosphor is applied to a blue light emitting device and the device starts driving with 3.3 V and 12 mA, and y2 is a y value of light in the CIE 1931 chromaticity diagram, the light being emitted after driving is carried out under the preceding driving conditions at 85° C. for 24 hours. In this case, the variation in y of light emitted from the phosphor in the CIE 1931 diagram coordinate may be −0.0065 or less.

The β-sialon phosphor prepared by an exemplary method includes the first sintered body that is obtained by sintering the silicon precursor and the aluminum precursor except for the active material precursor and is represented by Formula 1:

$Si_{(6-x)}Al_xO_yN_{(8-y)}:Re_z$,  [Formula 1]

where 0.1<x<2, 0.1<y<2, 0.001<z<0.1, and Re is a rare-earth element.

The β-sialon phosphor is a green phosphor and emits light with a peak wavelength of 500 to 555 nm, preferably 530 to 545 nm. Blue or ultraviolet light may be used as an excitation source to excite the β-sialon phosphor according to one example.

Further, in one example, the phosphor may further include alkaline earth metal selected from the group consisting of magnesium (Mg), calcium (Ca), strontium (Sr), and barium (Ba). The phosphor may further include manganese (Mn).

The alkali earth metal or manganese included in the phosphor does not substitute silicon or aluminum forming the host matrix but is added as a dopant to the interstitial sites of the crystal structure. Ultimately, in certain examples, addition of alkali earth metal or manganese neither deforms nor affects the crystal structure of the host matrix.

Further, the alkaline earth metal or manganese contributes to phase stabilization of the β-sialon phosphor, thereby improving reliability, enhancing light emitting efficiency, and shortening a wavelength of light.

Hereinafter, the present application will be explained in more detail with reference to examples, in which β-sialon phosphors are prepared by the method for preparing the β-sialon phosphor according to the present example.

In the following examples, the silicon precursor and the aluminum precursor are measured and mixed by a ball mill or a mixer, thereby preparing a first mixture. The first mixture of the precursors is put in a container resistant to a high temperature, such as a BN crucible, which is put in an electric furnace where pressure firing and vacuum firing are conducted. The first mixture is heated at 1,500° C. or higher and a gas pressure of 0.2 MPa to 2 MPa in a nitrogen containing atmosphere by elevating temperature at 20° C./min or less, thereby preparing a first sintered body.

Subsequently, the first sintered body is mixed with an active material containing compound into a second mixture, which is subjected to heat treatment at 1.000° C. or higher and a gas pressure of 0.2 MPa to 2 MPa in a nitrogen containing atmosphere by elevating temperature at 20° C./min or less, thereby preparing a second sintered body.

Both phosphors obtained from Examples 1 to 9, in which the silicon precursor and the aluminum precursor are mixed by varying a mixing ratio, followed by addition of the active material precursor and heat treatment, and phosphors obtained from Comparative Examples 1 to 4, in which the silicon precursor, the aluminum precursor, and the active material precursor are mixed all together and sintered, are a Eu-activated β-sialon phosphor, which emits green light with a peak wavelength of 500 to 555 nm, preferably 530 to 545 nm.

Example 1

Silicon nitride ($Si_3N_4$) and aluminum nitride (AlN) were used as a silicon precursor and an aluminum precursor, respectively, 9.6624 g of $Si_3N_4$ and 0.3376 g of AlN were mixed using a mixer and a sieve and tamped into a BN crucible, which was set in a pressure-resistant electric furnace. For sintering, the electric furnace was heated to 500° C. in a vacuum state and supplied with an $N_2$ gas at 500° C. The mixture was sintered at 2,050° C. for 5 hours in an $N_2$ gas atmosphere by elevating temperature at 10° C./min from 500° C. to 2,050° C. and maintaining a gas pressure of 0.9 MPa or higher. Then, the mixture was cooled, and the crucible was taken out of the electric furnace. The resulting first sintered body was ground and subjected to a 100-mesh sieve.

10 g of the first sintered body and 0.1324 g of europium oxide ($Eu_2O_3$) as an active material were mixed using a mixer and a sieve. The mixture was sintered at 1,900° C. for 8 hours in an $N_2$ gas atmosphere by elevating temperature at 10° C./min from 500° C. to 1,900° C. and maintaining a gas pressure of 0.9 MPa or higher. Then, the mixture was cooled, and the crucible was taken out of the electric furnace. The resulting second sintered body was ground and subjected to a 100-mesh sieve.

Example 2

A β-sialon phosphor was prepared in the same manner as in Example 1 except that 9.6624 g of $Si_3N_4$, 0.3376 g of AlN, and 0.1324 g of $Eu_2O_3$ were used and second sintering was carried out at 1,800° C.

Example 3

A β-sialon phosphor was prepared in the same manner as in Example 1 except that 9.6624 g of $Si_3N_4$, 0.3376 g of AlN, and 0.1324 g of $Eu_2O_3$ were used and second sintering was carried out at 1,500° C.

Example 4

A β-sialon phosphor was prepared in the same manner as in Example 1 except that 9.6624 g of $Si_3N_4$, 0.3376 g of AlN, and 0.0315 g of $Eu_2O_3$ were used.

Example 5

A β-sialon phosphor was prepared in the same manner as in Example 1 except that 9.6624 g of $Si_3N_4$, 0.3376 g of AlN, and 0.0630 g of $Eu_2O_3$ were used.

Example 6

A β-sialon phosphor was prepared in the same manner as in Example 1 except that 9.6624 g of $Si_3N_4$, 0.3376 g of AlN, and 0.0945 g of $Eu_2O_3$ were used.

Example 7

A β-sialon phosphor was prepared in the same manner as in Example 1 except that 9.6624 g of $Si_3N_4$, 0.3376 g of AlN, and 0.1575 g of $Eu_2O_3$ were used.

Example 8

A β-sialon phosphor was prepared in the same manner as in Example 1 except that 9.6624 g of $Si_3N_4$, 0.3376 g of AlN, and 0.1890 g of $Eu_2O_3$ were used.

Example 9

A β-sialon phosphor was prepared in the same manner as in Example 1 except that 9.6624 g of $Si_3N_4$, 0.3376 g of AlN, and 0.2521 g of $Eu_2O_3$ were used.

Comparative Example 1

Silicon nitride ($Si_3N_4$) and aluminum nitride (AlN) were used as a silicon raw material and an aluminum raw material, respectively, 9.6624 g of $Si_3N_4$, 0.3376 g of AlN, and 0.1324 g of europium oxide ($Eu_2O_3$) were mixed using a mixer and a sieve and tamped into a BN crucible. Which was set in a pressure-resistant electric furnace. For sintering, the electric furnace was heated to 500° C. in a vacuum state and supplied with an $N_2$ gas at 500° C. The mixture was sintered at 2,050° C. for 5 hours in an $N_2$ gas atmosphere by elevating temperature at 10° C./min from 500° C. to 2,050° C. and maintaining a gas pressure of 0.9 MPa or higher. Then, the mixture was cooled, and the crucible was taken out of the electric furnace. The resulting phosphor was ground and subjected to a 50-mesh sieve, thereby obtaining a phosphor.

The obtained phosphor was washed and dispersed with hydrofluoric acid and hydrochloric acid, and dried sufficiently, and sorted using a 50-mesh sieve, thereby obtaining a phosphor of Comparative Example 1.

Comparative Example 2

A β-sialon phosphor was prepared in the same manner as in Comparative Example 1 except that 9.6624 g of $Si_3N_4$, 0.3376 g of AlN, and 0.1324 g of $Eu_2O_3$ were used and second sintering was carried out at 1,900° C.

Comparative Example 3

A β-sialon phosphor was prepared in the same manner as in Comparative Example 1 except that 9.6624 g of $Si_3N_4$, 0.3376 g of AlN, and 0.1324 g of $Eu_2O_3$ were used and second sintering was carried out at 1,800° C.

Comparative Example 4

A β-sialon phosphor was prepared in the same manner as in Comparative Example 1 except that 9.6624 g of $Si_3N_4$, 0.3376 g of AlN, and 0.1324 g of $Eu_2O_3$ were used and second sintering was carried out at 1,500° C.

Compositions of raw materials used in the examples and the comparative examples are illustrated in Table 1.

TABLE 1

| Example No. | $Si_3N_4$ (g) | AlN (g) | $Eu_2O_3$ (g) | Concentration of added $Eu^{2+}$ (mol) | Concentration of added $Eu^{2+}$ (mol %) |
|---|---|---|---|---|---|
| Example 1 | 9.6624 | 0.3376 | 0.1324 | 0.02 | 0.1429 |
| Example 2 | 9.6624 | 0.3376 | 0.1324 | 0.02 | 0.1429 |
| Example 3 | 9.6624 | 0.3376 | 0.1324 | 0.02 | 0.1429 |
| Example 4 | 9.6624 | 0.3376 | 0.0315 | 0.005 | 0.0357 |
| Example 5 | 9.6624 | 0.3376 | 0.0630 | 0.01 | 0.0714 |
| Example 6 | 9.6624 | 0.3376 | 0.0945 | 0.015 | 0.1071 |
| Example 7 | 9.6624 | 0.3376 | 0.1575 | 0.025 | 0.1786 |
| Example 8 | 9.6624 | 0.3376 | 0.1890 | 0.03 | 0.2143 |
| Example 9 | 9.6624 | 0.3376 | 0.2521 | 0.04 | 0.2857 |
| Comparative Example 1 | 9.6624 | 0.3376 | 0.1324 | 0.02 | 0.1429 |
| Comparative Example 2 | 9.6624 | 0.3376 | 0.1324 | 0.02 | 0.1429 |
| Comparative Example 3 | 9.6624 | 0.3376 | 0.1324 | 0.02 | 0.1429 |
| Comparative Example 4 | 9.6624 | 0.3376 | 0.1324 | 0.02 | 0.1429 |

Further, compositions of raw materials and sintering temperatures in Examples 1 to 3 and Comparative Examples 1 to 4 are listed in Table 2.

TABLE 2

| Example No. | $Si_3N_4$ (g) | AlN (g) | $Eu_2O_3$ (g) | Time to add Eu | Sintering temperature at time to add Eu (° C.) |
|---|---|---|---|---|---|
| Example 1 | 9.6624 | 0.3376 | 0.1324 | Second sintering | 1900 |
| Example 2 | 9.6624 | 0.3376 | 0.1324 | Second sintering | 1800 |
| Example 3 | 9.6624 | 0.3376 | 0.1324 | Second sintering | 1500 |
| Comparative Example 1 | 9.6624 | 0.3376 | 0.1324 | First sintering | 2050 |
| Comparative Example 2 | 9.6624 | 0.3376 | 0.1324 | First sintering | 1900 |
| Comparative Example 3 | 9.6624 | 0.3376 | 0.1324 | First sintering | 1800 |
| Comparative Example 4 | 9.6624 | 0.3376 | 0.1324 | First sintering | 1500 |

The phosphors prepared in Example 1 and Comparative Example 1 were analyzed by powder X-ray diffraction (XRD), and analysis results are shown in FIG. 3. The prepared phosphors are identified as a β-sialon phosphor with reference to FIG. 3 and Joint Committee on Powder Diffraction Standards (JCPDS) data.

Figure 4:
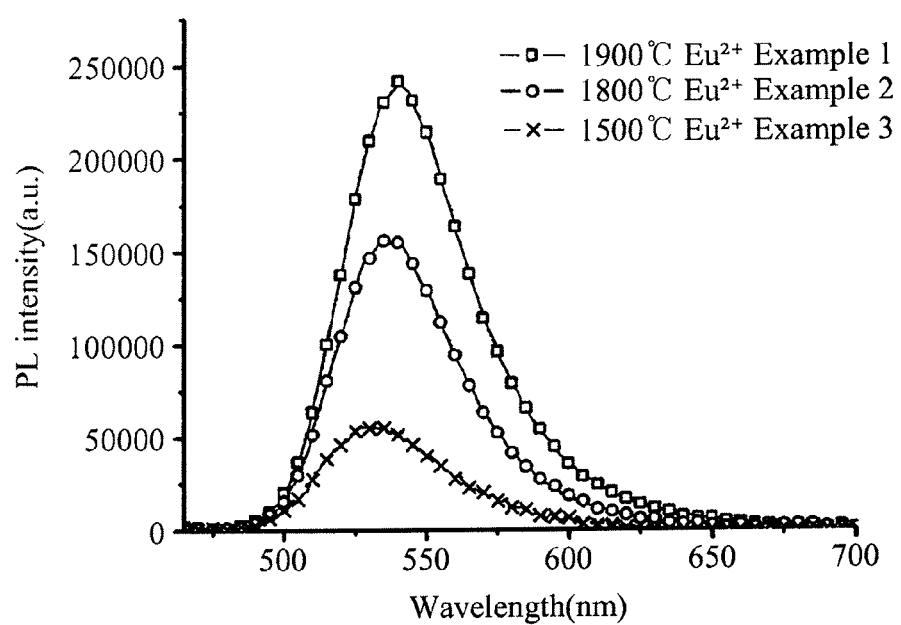
FIG. 4 is a graph illustrating emission spectra of β-sialon phosphors prepared in Examples 1 to 3.

Further, light emitting characteristics of the phosphors were evaluated by irradiation of a 450 nm excitation source, wherein emission spectra of the β-sialon phosphors of Example 1 to 3 are shown in FIG. 4. The β-sialon phosphor of Example 1 is a green light emitting phosphor with peak emission at 540 nm and a half-width of 51.7 nm. Luminance of the β-sialon phosphor of Example 1 is 7% higher than that of the 1-sialon phosphor of Comparative Example 1.

Figure 5:
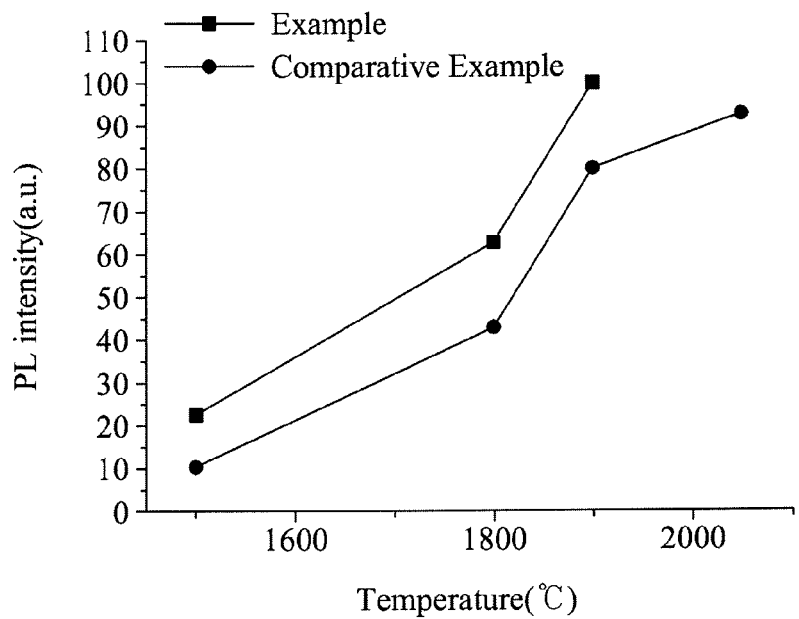
FIG. 5 is a graph illustrating PL intensities of β-sialon phosphors prepared in Examples 1 to 3 and Comparative Examples 1 to 4 according to temperature.

Also, photoluminescence (PL) intensities of the β-sialon phosphors prepared in Examples 1 to 3 and Comparative Examples 1 to 4 according to temperature are shown in FIG. 5. The PL intensities of the β-sialon phosphors of the examples are higher than those of the β-sialon phosphors of the comparative examples in the entire temperature range.

Figure 6:
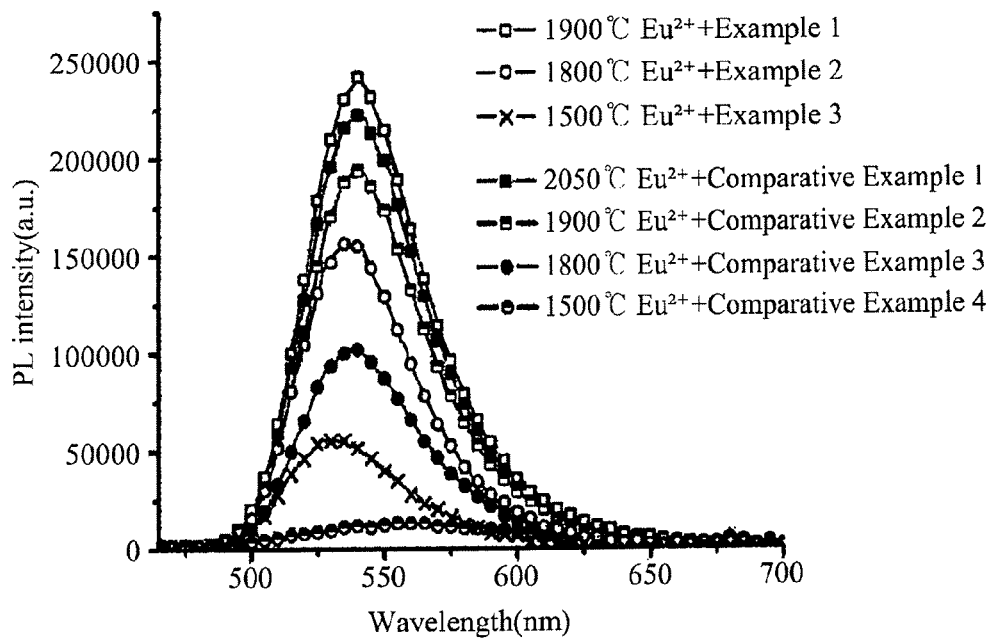
FIG. 6 is a graph illustrating PL intensities of β-sialon phosphors prepared in Examples 1 to 3 and Comparative Examples 1 to 4 according to a wavelength.

FIG. 6 is a graph illustrating PL intensities of the β-sialon phosphors prepared in Examples 1 to 3 and Comparative Examples 1 to 4 according to a wavelength. As shown in FIG. 6, light emitting devices using the β-sialon phosphors of the examples show higher PL intensities at each temperature in a range from 525 nm to 555 nm than those of the comparative examples.

Accordingly, the light emitting devices using the β-sialon phosphors of the examples have a higher luminance.

In addition, integrated intensities of the β-sialon phosphors prepared in Examples 1 and 4 to 9 excited by a 450 nm excitation source are shown in FIG. 7. Peak emission wavelengths and half-widths of the β-sialon phosphors prepared in Examples 1 and 4 to 9 excited by the 450 nm excitation source are shown in FIG. 8. Here, an amount of added Eu is set to 0.036 to 0.29 mol %. Considering both luminance and half-width (see FIG. 8), the amount of added Eu is preferably 0.11 to 0.21 mol %.

Moreover, particle size distribution of the β-sialon phosphors according to the examples may be properly controlled by grinding and sorting. Regarding particle size, D50 is preferably 2 to 100 μm, more preferably 5 to 25 μm. In addition, D10 may be 1 to 15 μm, and D90 may be 15 to 30 μm.

FIG. 9 is a cross-sectional view illustrating a white light emitting device package 100 according to an example of the present application.

As shown in the example of FIG. 9, the white light emitting device package 100 includes a light emitting device 120 to emit excited light and a wavelength conversion unit 140 to absorb the excited light and convert a wavelength of the excited light.

Further, the white light emitting device package 100 includes a lead frame 110 on which a light emitting chip 120 is mounted and a wire 130 to electrically connect the light emitting chip 120 to two lead frames 110a and 110b.

The light emitting device 120 may be a blue light emitting element or an ultraviolet light emitting element based on a wavelength of emitted light. That is, the light emitting device 120 may emit light in a ultraviolet or visible wavelength range. For example, light in a visible wavelength range may include blue, red, green, or yellow light.

The wavelength conversion unit 140 may include a sialon phosphor containing a first sintered body obtained by sintering a silicon precursor and an aluminum precursor except for an active material precursor and represented by Formula 1:

$$Si_{(6-x)}Al_xO_yN_{(8-y)}:Re_z,$$ [Formula 1]

where $0.1<x<2$, $0.1<y<2$, $0.001<z<0.1$, and Re is a rare-earth element.

Regarding the sialon phosphor containing the first sintered body obtained by sintering the silicon precursor and the aluminum precursor except for the active material precursor in the wavelength conversion unit 140, as the first sintered body as a host matrix material is formed first to stably ensure a crystal structure, and then mixed with the active material, the active material is located in interstitial sites of the crystal structure, not in Si or Al positions, thereby preventing degradation of crystallinity of the first sintered body. That is, the first sintered body of the silicon precursor and the aluminum precursor is included in the phosphor of the present example, maintaining the crystal structure thereof.

Further, in accordance with the example, since the sialon phosphor prepared secures a stable crystal structure and exhibits superior thermal stability at a high temperature, a decrease in efficiency thereof caused by a shortened lifespan thereof is insignificant even over a long-term operation. Specifically, the sialon phosphor is not easily deteriorated by heat generated from the light emitting chip.

Accordingly, due to a stable crystal structure of the sialon phosphor prepared by the preceding method, a light emitting device package including the sialon phosphor may prevent a decrease in luminance caused by crystallinity degradation.

The wavelength conversion unit 140 may have a lens shape convex upward. In one example, the wavelength conversion unit 140 has, for example, a semispherical lens shape so as to secure a wide angle of beam spread. The wavelength conversion unit 140 may be formed of a silicone resin, an epoxy resin, or a combination thereof.

Green phosphors 141 and red phosphors 142 may be dispersed in the wavelength conversion unit 140. In one example, a combination of particular green phosphors 141 and particular red phosphors 142 is provided in consideration of half-width, peak emission wavelength and/or conversion efficiency, thereby providing white light with a high color rendering index of 70 to 80. Further, light with a wide range of wavelengths is obtained due to a plurality of phosphors, thereby improving color reproducibility.

A blue light emitting device chip may have a major wavelength of 430 to 455 nm. In this case, the green phosphors may have a peak emission wavelength of 500 to 555 nm and the red phosphors may have a peak emission wavelength of 610 to 660 nm so as to improve a color rendering index by securing a wide visible spectrum.

Preferably, the blue light emitting device chip has a half-width of 10 to 30 nm, the green phosphors have a half-width of 30 to 120 nm, and the red phosphors have a half-width of 50 to 120 nm.

Moreover, in one embodiment, the wavelength conversion unit 140 may further include yellow or golden yellow phosphors 143 in addition to the red phosphors 142 and the green phosphors 141. In this case, an enhanced color rendering index may be secured.

Although the aforementioned example illustrates that two or more kinds of phosphor powder are mixed and dispersed in a single wavelength conversion unit, various modifications and alternatives may be realized. Specifically, two or three types of phosphors may be provided in different layers. For instance, powder of green phosphors, red phosphors and yellow or golden yellow phosphors is dispersed by high pressure, thereby providing a double-layer phosphor film.

FIG. 10 illustrates an emission spectrum of a white light emitting device according to one example of the present application. In the example, white light obtained via combination of phosphors may secure high color reproducibility and a high color rendering index.

Referring to FIG. 10, in a conventional art, when a yellow phosphor is combined with a blue light emitting device chip, converted yellow light may be obtained along with light with a blue wavelength. In the entire visible spectrum, light with green and red wavelengths is hardly present, and thus it is difficult to secure a color rendering index close to that of natural sunlight. In particular, since the converted yellow light has a narrow half-width so as to obtain high conversion efficiency, a color rendering index thereof becomes low. Further, in the conventional art, characteristics of white light expressed based on a conversion level of simple yellow light vary easily, thus making it difficult to secure excellent color reproducibility.

On the contrary, in an example where a blue light emitting device chip is combined with a green phosphor and a red phosphor, light is emitted in green and red wavelength ranges as compared with the conventional art, thereby obtaining a broader range in a visible spectrum and significantly improving a color rendering index. In addition, yellow or golden yellow phosphors to provide an intermediate wavelength range are further included between the green and red wavelength ranges, thereby remarkably improving a color rendering index.

0.0378 parts by weight of the β-sialon phosphor of Example 1, 0.0056 parts by weight of a CaAlSiN$_3$:Eu phosphor as a red phosphor and 1 part by weight of a silicon resin, and 0.041 parts by weight the β-sialon phosphor of Comparative Example 1, 0.0067 parts by weight of the CaAlSiN$_3$:Eu phosphor as a red phosphor and 1 part by weight of the silicone resin are properly mixed into slurries, each of which is injected into a cup on a mount lead, on which a blue light emitting device is mounted, and cured at 160° C. for 2 hours, thereby preparing a white light emitting device using each phosphor.

The phosphors of Example 1 and Comparative Example 1 have a peak emission wavelength of about 540 nm, which are identified as a green phosphor. The white light emitting device using the phosphor of Example 1 has a luminance of 9.8 to 10 ed, which is relatively higher than a luminance of 9.6 to 9.7 in Comparative Example 1.

The foregoing β-sialon phosphor may be effectively applied to both a light emitting device and a module to provide white light in combinations with other phosphors.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The invention claimed is:

1. A method for preparing a sialon phosphor, the method comprising steps of:
  forming a first sintered body by mixing and sintering a silicon precursor and an aluminum precursor; and
  forming a second sintered body by mixing and heat-treating the first sintered body and an active material precursor, the active material precursor including a rare earth element,
  wherein the sialon phosphor is represented by Formula 1:

$$Si_{(6-x)}Al_xO_yN_{(8-y)}:Re_z,$$ [Formula 1]

where $0.1 < x < 2$, $0.1 < y < 2$, $0.001 < z < 0.1$, and Re is a rare-earth element.

2. The method of claim 1, wherein the silicon precursor comprises metallic silicon or a silicon compound.

3. The method of claim 2, wherein the silicon compound is selected from the group consisting of silicon nitride and silicon oxide.

4. The method of claim 1, wherein the aluminum precursor comprises metallic aluminum or an aluminum compound.

5. The method of claim 4, wherein the aluminum compound is selected from the group consisting of aluminum nitride, aluminum oxide, and aluminum hydroxide.

6. The method of claim 1, wherein the rare-earth element is selected from the group consisting of Eu and Ce.

7. The method of claim 1, wherein the sintering is performed at a temperature between 1,500° C. to 2,200° C.

8. The method of claim 1, wherein the heat-treating is performed at a temperature between 1,000° C. to 2,100° C.

9. The method of claim 1, wherein the sintering and the heat-treating are performed in a nitrogen containing atmosphere.

10. The method of claim 9, wherein a pressure of nitrogen gas in the nitrogen containing atmosphere is 0.1 to 10 MPa.

11. The method of claim 1, wherein the mixing of the first sintered body and the active material precursor comprises mixing with a compound containing an alkaline earth metal.

12. The method of claim 11, wherein the alkaline earth metal is selected from the group consisting of magnesium (Mg), calcium (Ca), strontium (Sr), and barium (Ba).

13. The method of claim 1, wherein mixing of the first sintered body and the active material precursor comprises mixing with a manganese (Mn) containing compound.

14. The method of claim 1, wherein the sialon phosphor emits light with a wavelength of 500 to 555 nm.

15. The method of claim 1, further comprising grinding the first sintered body after the forming of the first sintered body.

16. The method of claim 1, further comprising grinding the second sintered body after the forming of the second sintered body.

17. A sialon phosphor comprising:
  a first sintered body obtained by sintering a silicon precursor and an aluminum precursor and forming a host matrix material, and an active material disposed in interstitial sites of the host matrix material, the active material including a rare earth element, the sialon phosphor being represented by Formula 1:

$$Si_{(6-x)}Al_xO_yN_{(8-y)}:Re_z,$$ [Formula 1]

where $0.1 < x < 2$, $0.1 < y < 2$, $0.001 < z < 0.1$, and Re is a rare-earth element,
  wherein the sialon phosphor further comprises an alkaline earth metal selected from the group consisting of magnesium (Mg), calcium (Ca), strontium (Sr), and barium (Ba) or a manganese (Mn) containing compound.

18. The sialon phosphor of claim 17, wherein the sialon phosphor emits light with a wavelength of 500 to 555 nm by blue or ultraviolet light as an excitation source.

19. A light emitting device package comprising:
  a light emitting device to emit excited light; and
  a wavelength conversion unit to absorb the excited light and convert a wavelength of the excited light,
  wherein the wavelength conversion unit comprises:
  a sialon phosphor comprising a first sintered body obtained by sintering a silicon precursor and an aluminum precursor and forming a host matrix material, and an active material disposed in interstitial sites of the host matrix material, the active material including a rare earth element, the sialon phosphor being represented by Formula 1:

$$Si_{(6-x)}Al_xO_yN_{(8-y)}:Re_z,$$ [Formula 1]

where $0.1 < x < 2$, $0.1 < y < 2$, $0.001 < z < 0.1$, and Re is a rare-earth element, wherein the sialon phosphor further comprises an alkaline earth metal selected from the group consisting of magnesium (Mg), calcium (Ca), strontium (Sr), and barium (Ba) or a manganese (Mn) containing compound.

20. The light emitting device package of claim 19, wherein the sialon phosphor emits light with a wavelength of 500 to 555 nm by blue or ultraviolet light as an excitation source.

21. The light emitting device package of claim 19, further comprising a red phosphor,
   wherein output light from the light emitting device package is white light.

* * * * *